US007113061B2

(12) United States Patent
Ootori et al.

(10) Patent No.: US 7,113,061 B2
(45) Date of Patent: Sep. 26, 2006

(54) TUNER UNIT HAVING A TUNER BOARD WITHIN THE HEIGHT LIMIT OF A TUNER SIGNAL CONNECTOR

(75) Inventors: Yasuhiro Ootori, Tokyo (JP); Kenichi Nagase, Chiba (JP); Mitsuyuki Tokusashi, Tokyo (JP); Tomonori Hasegawa, Tokyo (JP); Hironori Yagi, Tokyo (JP)

(73) Assignee: Sony Computer Entertainment Inc., Tokyo (JP)

( * ) Notice: Subject to any disclaimer, the term of this patent is extended or adjusted under 35 U.S.C. 154(b) by 0 days.

(21) Appl. No.: 10/991,164

(22) Filed: Nov. 16, 2004

(65) Prior Publication Data

US 2005/0162242 A1 Jul. 28, 2005

Related U.S. Application Data

(63) Continuation of application No. PCT/JP03/02061, filed on Feb. 25, 2003.

(51) Int. Cl.
*H05K 5/02* (2006.01)

(52) U.S. Cl. .................... 334/85; 361/816; 361/818

(58) Field of Classification Search .................. 334/85; 361/816, 818
See application file for complete search history.

(56) References Cited

U.S. PATENT DOCUMENTS 6,011,700 A * 1/2000 Matsuzaki .................. 361/816
6,118,672 A * 9/2000 Yamauchi et al. .......... 361/818
6,388,892 B1 * 5/2002 Maeda ....................... 361/801

FOREIGN PATENT DOCUMENTS

| JP | 9-097993 | 4/1997 |
| JP | 10-022674 | 1/1998 |
| JP | 11-317686 | 11/1999 |
| JP | 2002-010172 | 1/2002 |

OTHER PUBLICATIONS

International Search Report dated May 20, 2003.

* cited by examiner

*Primary Examiner*—Benny Lee
(74) *Attorney, Agent, or Firm*—Katten Muchin Rosenman LLP (57) ABSTRACT

A receiver (2) includes tuner units (1) and (3), and a circuit board (21). The tuner unit (1) includes a connector (11), a tuner board (12), and a housing (13) for accommodating them. The tuner board (12) is positioned within the limit of a height dimension L perpendicular to the direction of connection (depicted by an arrow P) of the connector (11). In addition, a recess (141B) is formed in the housing (13), in which the circuit board (21) disposed on the recess (141B) is also positioned within the limit of the height dimension L perpendicular to the direction of connection (depicted by an arrow P) of the connector (11).

7 Claims, 7 Drawing Sheets

TUNER UNIT HAVING A TUNER BOARD WITHIN THE HEIGHT LIMIT OF A TUNER SIGNAL CONNECTOR

CROSS-REFERENCE TO RELATED APPLICATION

The present application is a continuation of International Application No. PCT/JP03/02061 which was filed on Feb. 25, 2003, which is herein incorporated by reference.

TECHNICAL FIELD

The present invention relates to a tuner unit, a receiver or an electronic device including the tuner unit.

BACKGROUND ART

Figure 7:
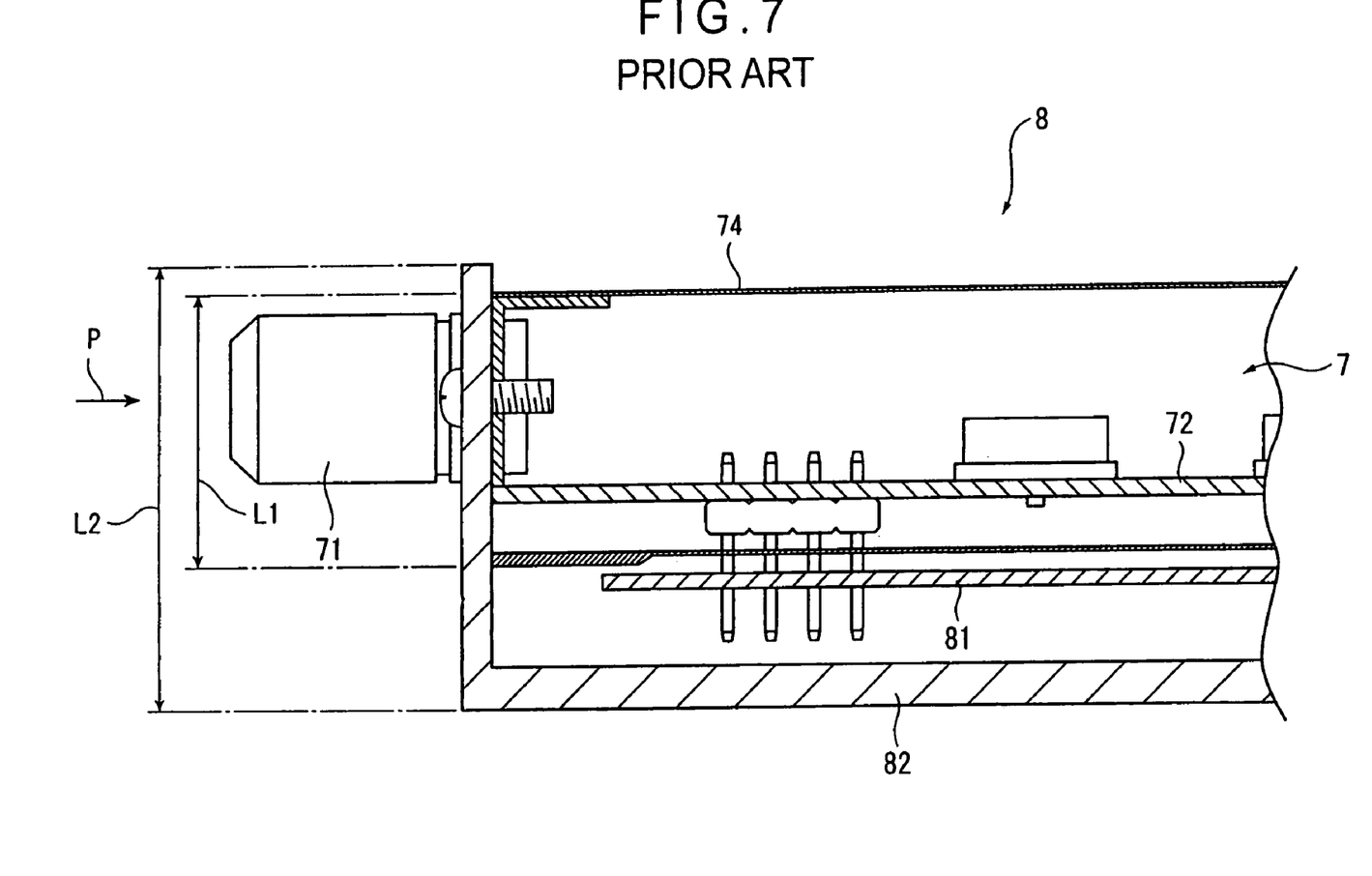
FIG. 7 is a cross sectional view illustrating a prior art receiver.

In the past, a receiver 8 has been employed for receiving broadcasting such as digital satellite broadcasting or digital terrestrial broadcasting. The receiver 8 includes, as shown in FIG. 7, a connector 71 for inputting signals including a plurality of different frequency signals, a tuner unit 7 having a tuner board 72 for tuning to signals fed from the connector 71, and a circuit board 81 on which the tuner unit 7 is installed. The tuner unit 7 is assembled by stacking the connector 71 on the tuner board 72 so that the direction of connection (depicted by an arrow P) of the connector 71 is aligned parallel to the surface of the tuner board 72 and subsequently accommodating them into a housing 74, while the receiver 8 is assembled by stacking the tuner unit 7 thus assembled on the circuit board 81 and accommodating them into an external casing 82.

There is an increasing demand recently for reducing the thickness of the receiver 8 and the tuner unit 7, however there is a difficulty in reducing the thickness because a height dimension L1 (height dimension of the housing 74) of the tuner unit 7 thus assembled is the sum of at least the height dimension perpendicular to the direction of connection of the connector 71 and the height dimension of the tuner board 72. Furthermore, a height dimension L2 (height dimension of the external casing 82) of the receiver 8 is the sum of height dimensions of at least the tuner unit 7 and the circuit board 81.

An object of the present invention is to provide a tuner unit that can be reduced in thickness and a receiver including the tuner unit.

SUMMARY OF THE INVENTION

A tuner unit according to an aspect of the present invention installed on a circuit board for tuning to a predetermined frequency signal from among signals including a plurality of different frequency signals and for outputting the signal to the circuit board, includes: a connector for inputting the plurality of different frequency signals; and a tuner board having a circuit element installed thereon for tuning to signals input to the connector and having a terminal installed thereon for outputting the processed signals to the circuit board, in which the connector is installed on an edge of the tuner board so that a direction along the surface of the tuner board is chosen to be the direction of connection, and the tuner board is positioned within the limit of a height dimension perpendicular to the direction of connection of the connector.

According to the present invention of such an arrangement, the height dimension of the tuner unit can be reduced compared with the conventional arrangement of stacking the connector on the tuner board. As a result, a tuner unit with a reduced thickness can be realized because the tuner board is positioned within the limit of the height dimension perpendicular to the direction of connection of the connector.

Preferably at this time, the direction of connection of the terminal may be chosen to be an out-of-plane direction of the tuner board, the tuner unit may include a housing for accommodating the tuner board with the connector and the terminal exposed, and the housing may have a recess formed thereon, the recess denting inward at a portion of the housing where the terminal is exposed, and when the circuit board is disposed on the recess, the circuit board may be positioned within the limit of the height dimension of the connector.

According to the present invention, the recess is formed on the housing, and when the circuit board is disposed on this recess, the circuit board is positioned within the limit of height dimension perpendicular to the direction of connection of the connector. Thus, if such a connector unit is employed, the reduction in thickness can also be realized when the circuit board is already installed.

Here, a signal processing unit can be contemplated, the signal processing unit including a connector for inputting signals from outside or outputting signals to outside; a signal processor for processing signals input from the connector or signals output from the connector; and a board having the signal processor installed thereon, and the signal processing unit also including another connector different from the connector, in which the board has a path formed thereon for connecting the other connector to an external circuitry of the signal processing unit. In the past, because the signal processing unit has nothing mounted thereon other than the connector being pre-connected to the signal processor installed on the board of the signal processing unit to input or output predetermined signals, it has been necessary to newly install another connector when attempting to input or output other signals, requiring extra effort. On the contrary, because the above-proposed signal processing unit includes another connector connected to the external circuitry via a path formed on the board, the trouble of installing another connector can be avoided.

In addition, because such a signal processing unit is self-contained as a tuner unit, it can also be applied to the aforementioned tuner unit. In other words, the following arrangement can be proposed.

In the above tuner unit, the tuner unit includes another connector different from the connector, and the tuner board has a path including a circuit and a terminal for outputting signals fed to the other connector directly to the circuit board, or a path including a circuit and a terminal for outputting signals fed from the circuit board to the other connector.

When the path is formed on the tuner board for outputting signals fed to another connector directly to the circuit board, other tuner units not having connectors, for example, can be mounted on the circuit board so that signals fed from another connector can be input to another tuner unit via the circuit board. Thus, by employing the tuner unit of the present invention, it becomes unnecessary to newly install a connector for inputting signals when mounting another tuner unit not having a connector on the circuit board, saving the trouble of installing a connector.

In addition, when the tuner board has the path formed thereon including a circuit and a terminal for outputting signals fed from the circuit board to another connector, which can be used for outputting signals by providing the circuit board with a branch circuit. Therefore it is not necessary to newly install an output connector, saving the trouble of installing an output connector.

Preferably at this time, the connector may be a type F connector for receiving television waves.

In addition, a tuner unit may be provided that is installed on a circuit board and subsequently accommodated, together with the circuit board, by an external casing, the tuner unit including: a tuner board having installed thereon a connector for inputting a plurality of different frequency signals and a circuit element for tuning to the signals fed to the connector, and also a terminal for outputting the processed signals to the circuit board; and a housing for accommodating the tuner board with the connector and terminal exposed, in which the housing is installed in the external casing, and secured to a boss extending in a direction perpendicular to the tuner board and may subsequently be inserted into the housing. Although this arrangement of the tuner unit can be applied to the tuner unit described above, the tuner unit alone can also constitute the present invention. In the past, securing the external casing to the tuner unit has been performed by inserting a securing member from a direction parallel to the tuner board. In this case, however, securing is performed laterally toward the external casing, which makes the securing difficult. On the contrary, the aforementioned tuner unit can be secured to the external casing from above because the tuner unit can be secured by inserting a securing member or the like into a boss which is perpendicular to the tuner board, thereby facilitating the securing.

An electronic device according to another aspect of the present invention includes a tuner unit for tuning to a predetermined frequency signal from among signals including a plurality of different frequency signals and outputting the signal to a circuit board, the tuner unit including: a connector for inputting the plurality of different frequency signals; and a tuner board having a circuit element installed thereon for tuning to signals fed to the connector and having a terminal installed thereon for outputting the processed signals to the circuit board, in which the connector is installed on an edge of the tuner board so that a direction along the surface of the tuner board is chosen to be the direction of connection, and the tuner board is positioned within the limit of a height dimension perpendicular to the direction of connection of the connector.

According to the present invention, the electronic device in itself can have a reduced thickness because the electronic device includes the tuner unit which can be reduced in thickness as described above.

A receiver according to still another aspect of the present invention for tuning to a predetermined frequency signal from among signals including a plurality of different frequency signals, processing the signal and outputting the signal outward, includes: a tuner unit for performing tuning; and a circuit board having the tuner unit mounted thereon and having a circuit element installed for processing signals fed from the tuner unit. The tuner unit includes: a connector for inputting the plurality of different frequency signals; a tuner board having a circuit element installed thereon for tuning to signals input to the connector and having a terminal installed thereon for outputting the processed signals to the circuit board; and a housing for accommodating the tuner board with the connector and the terminal exposed, in which the connector is installed on an edge of the tuner board so that a direction along the surface of the tuner board is chosen to be the direction of connection, the tuner board is positioned within the limit of a height dimension perpendicular to the direction of connection of the connector, the direction of connection of the terminal is chosen to be an out-of-plane direction of the tuner board, a recess denting inward for disposing the circuit board is formed on a portion of the housing where the terminal is exposed, and the circuit board disposed on the recess is positioned within the limit of the height dimension of the connector.

According to the present invention of the above arrangement, because the tuner board is positioned within the limit of height dimension perpendicular to the direction of connection of the connector, the tuner unit of the receiver can have a lower height dimension than the related art arrangement in which the connector is stacked on the tuner board. Due to this, the tuner unit can be reduced in thickness and the receiver having the tuner unit can also be reduced in thickness.

In addition, the tuner unit having the recess formed thereon, the receiver can be further reduced in thickness because the circuit board installed in the recess is positioned within the limit of height dimension perpendicular to the direction of connection of the connector, thereby preventing increase in height dimension due to installation of the circuit board. Thus the reduced thickness of the receiver according to the present invention enables it to be used in portable products, for example.

Preferably, the above receiver further may include: an external casing for accommodating the tuner unit and the circuit board, in which the housing includes a cover member having a pair of cover elements covering the front and the back sides of the tuner board, and a frame member disposed between the pair of cover elements and surrounding the tuner board for installing the connector on the frame member, the frame member includes an extension extending along the tuner board, the external casing has a boss formed thereon extending in a direction perpendicular to the tuner board and penetrating through at least one of the cover elements and subsequently being inserted into the housing, and the extension of the frame member and the cover member are secured to the boss.

When securing the tuner unit to the external casing, the boss of the external casing faces upward, the tuner unit is incorporated into the external casing from above the boss, and a securing member such as a screw is inserted into the boss from outside the cover element (from above) of the housing of the tuner unit to secure the tuner unit. Because the securing is realized by a securing member inserted from above as described, securing can be facilitated.

In addition, because the boss penetrates through the cover element and may subsequently be inserted into the housing, the position on the external casing for securing the housing of the tuner unit can be easily determined.

Preferably at this time, the tuner unit may include another connector for inputting signals different from those fed via the connector, the tuner board may have a path formed thereon including a circuit and a terminal for outputting signals fed to the other connector directly to the circuit board, and the circuit board may have a tuning circuit installed thereon for tuning to signals input via the path.

According to the present invention, the tuner unit has two connectors installed thereon, in which signals input from one of the connectors are tuned by the tuner board. Signals input from the other connector are directly input to the circuit board for subsequent processing by the tuning circuit on the circuit board. Therefore, it becomes possible to process signals from two different types of broadcasting in a single receiver.

In addition, because the above embodiment is arranged in a manner such that two connectors are pre-installed on the tuner unit and signals input from the other connector may be directly input to the circuit board, it is not necessary to newly install a connector on the circuit board for inputting signals, which can save trouble in manufacturing the receiver.

Preferably, the tuning circuit may be unitized, i.e. made or transformed into a single unit.

Unitization of the tuning circuit (e.g. by making or transforming into a single unit) can further simplify installation on the circuit board.

Preferably, the tuner unit and the tuning circuit may perform tuning of signals based on mutually different broadcasting types.

Such a receiver can be used, for example, in receiving both digital satellite broadcasting and digital terrestrial broadcasting.

Preferably, the tuner unit may include another connector different from the connector, the tuner board may have a path formed thereon including a circuit and a terminal for outputting signals fed from the circuit board to the other connector, and the circuit board may have a branch circuit installed thereon.

In such a receiver, because the branch circuit is installed on the circuit board and the tuner board has the path formed thereon including the circuit and the terminal for outputting signals fed from the circuit board to the other connector, signals fed from the circuit board can be output to the tuner board, and further, output from the other connector. Because the other connector of the tuner unit functions as a connector for outputting signals, there is no need to newly install a connector on the receiver to output signals, thereby facilitating manufacture of the receiver.

An electronic device according to yet another aspect of the present invention includes a receiver for tuning to a predetermined frequency signal from among signals including a plurality of different frequency signals, processing the signal and outputting the signal outward. The receiver includes: a tuner unit for tuning; and a circuit board having the tuner unit mounted thereon and having a circuit element installed thereon for processing signals fed from the tuner unit. The tuner unit includes: a connector for inputting the plurality of different frequency signals; a tuner board having a circuit element installed thereon for tuning to signals input to the connector and having a terminal installed thereon for outputting the processed signals to the circuit board; and a housing for accommodating the tuner board with the connector and the terminal exposed, in which the connector is installed on an edge of the tuner board so that a direction along the surface of the tuner board is chosen to be the direction of connection, the tuner board is positioned within the limit of a height dimension perpendicular to the direction of connection of the connector, the direction of connection of the terminal is chosen to be an out-of-plane direction of the tuner board, a recess protruding inward for disposing the circuit board is formed on a portion of the housing where the terminal is exposed, and the circuit board disposed on the recess is positioned within the limit of the height dimension of the connector.

According to the present invention, because the electronic device includes the aforementioned receiver with reduced thickness, the electronic device including the receiver can also be reduced in thickness in itself.

BEST MODE FOR CARRYING OUT THE INVENTION

An embodiment of the present invention will be explained below referring to the drawings.

Figure 1:
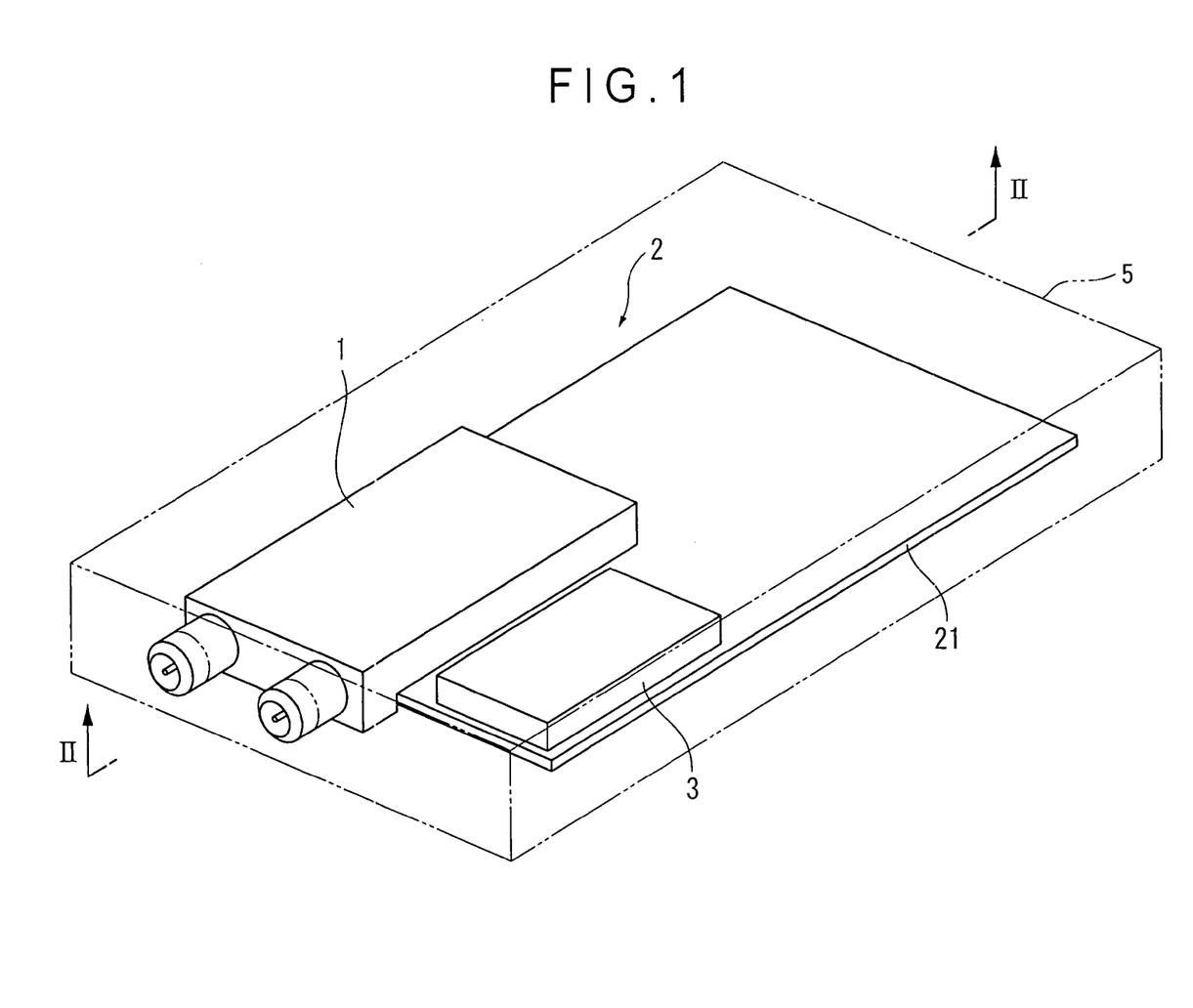
FIG. 1 is a perspective view illustrating a receiver according to an embodiment of the present invention.
Figure 2:
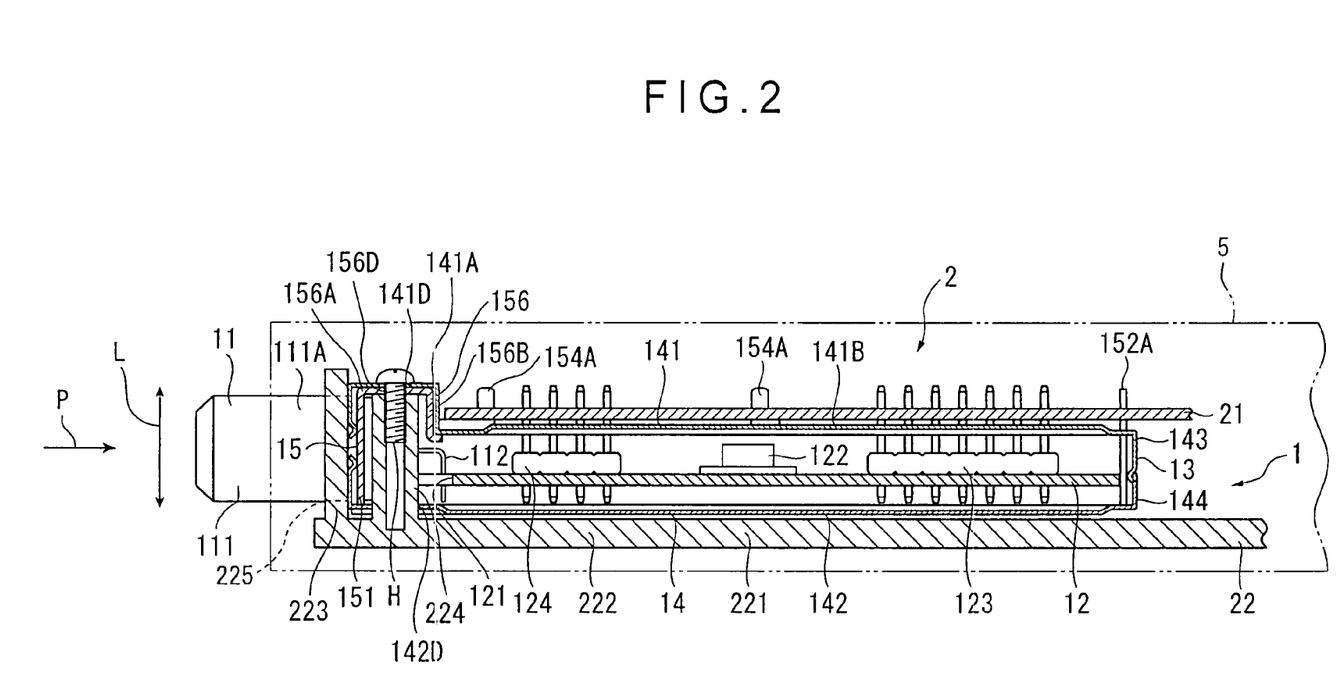
FIG. 2 is cross sectional view as taken along a line II—II of FIG. 1.

FIGS. 1 and 2 illustrate an electronic device 5 including a receiver 2 of the present invention. Here, the electronic device 5 may include a television unit, a video unit, a game unit, a personal compute or the like, and the receiver 2 is incorporated inside the electronic device 5. Although the present embodiment employs an arrangement in which the receiver 2 is incorporated inside the electronic device 5, an arrangement may also be possible in which the receiver 2 is externally installed to the electronic device.

For example, the receiver 2 is employed for receiving digital satellite broadcasting and digital terrestrial broadcasting, and processes are performed such as tuning to a signal of predetermined frequency from among signals including a plurality of different frequency signals having been input, and video signals and audio signals are generated based on the processed signals and output to a display unit (e.g., displays such as CRT) and an audio unit (e.g., loudspeaker) of the electronic device 5.

As shown in FIG. 1, the receiver 2 includes a tuner unit 1, a tuner unit 3, a circuit board 21 having the tuner units 1 and 3 installed thereon, and, as shown in FIG. 2, an external casing 22 accommodating them. Here, FIG. 2 is a cross sectional view as taken along a line II—II of FIG. 1, and, FIG. 1 shows an arrangement with the external casing 22 being omitted.

Figure 3:
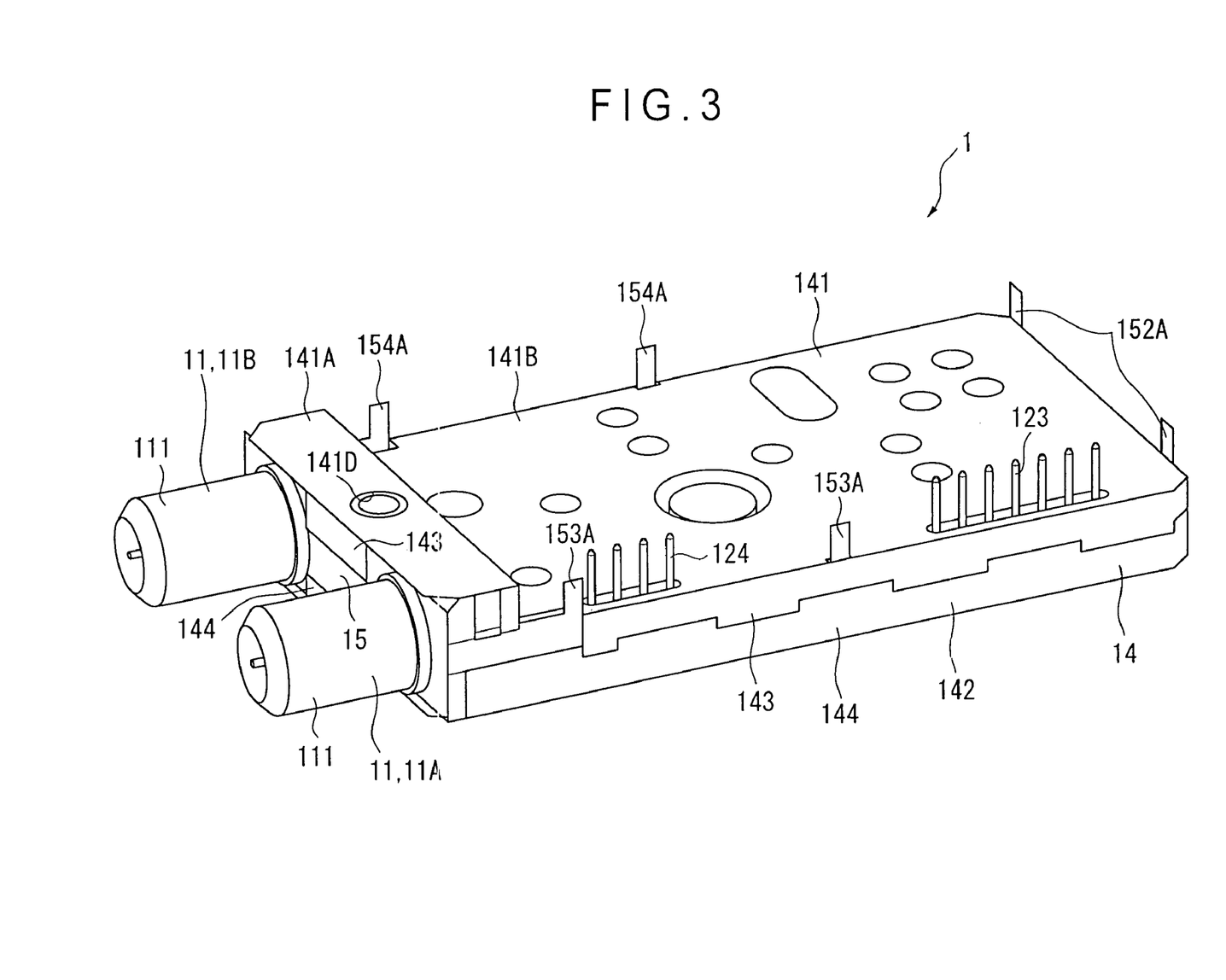
FIG. 3 is a perspective view illustrating a tuner unit.
Figure 4:
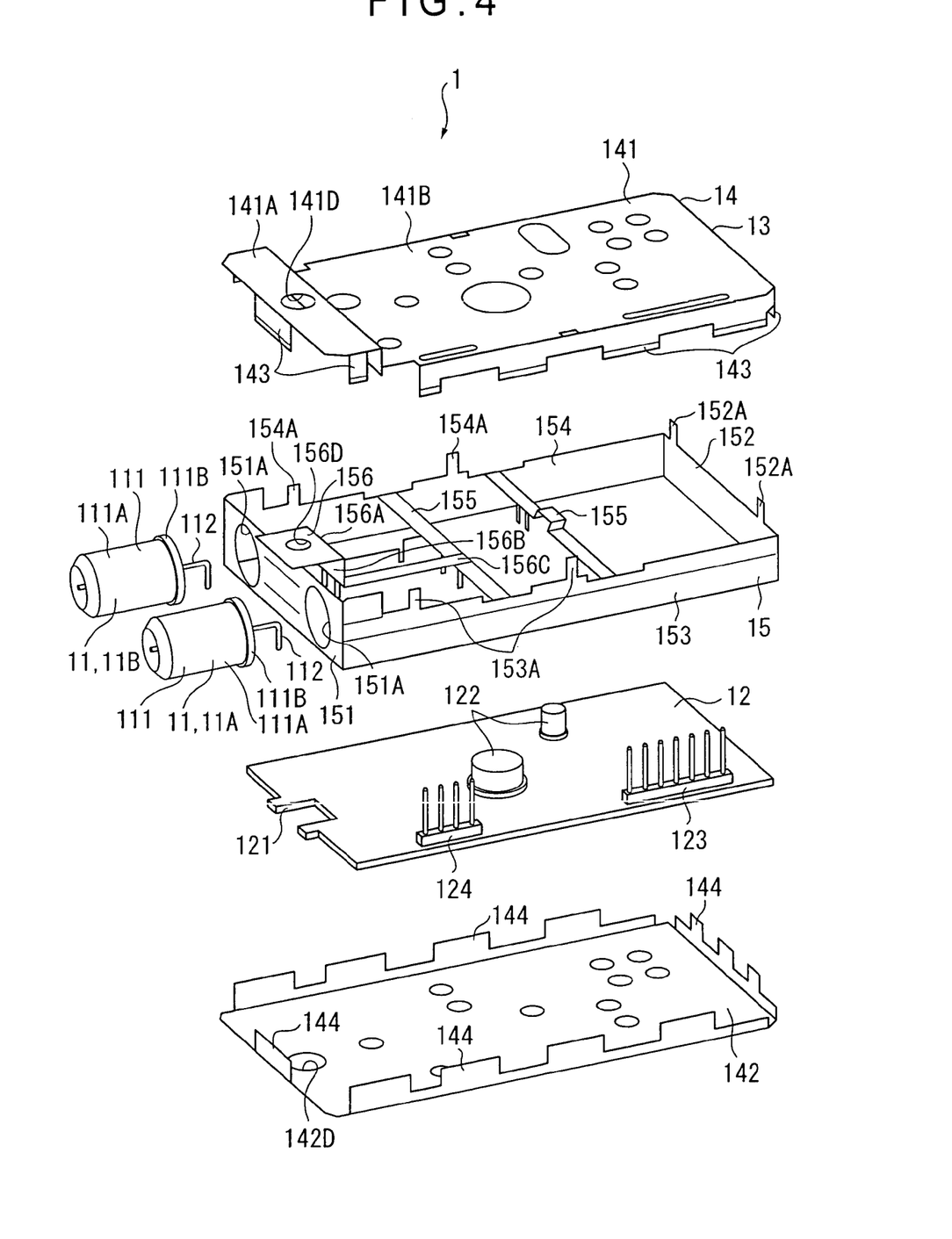
FIG. 4 is an exploded perspective view of the tuner unit.
Figure 5:
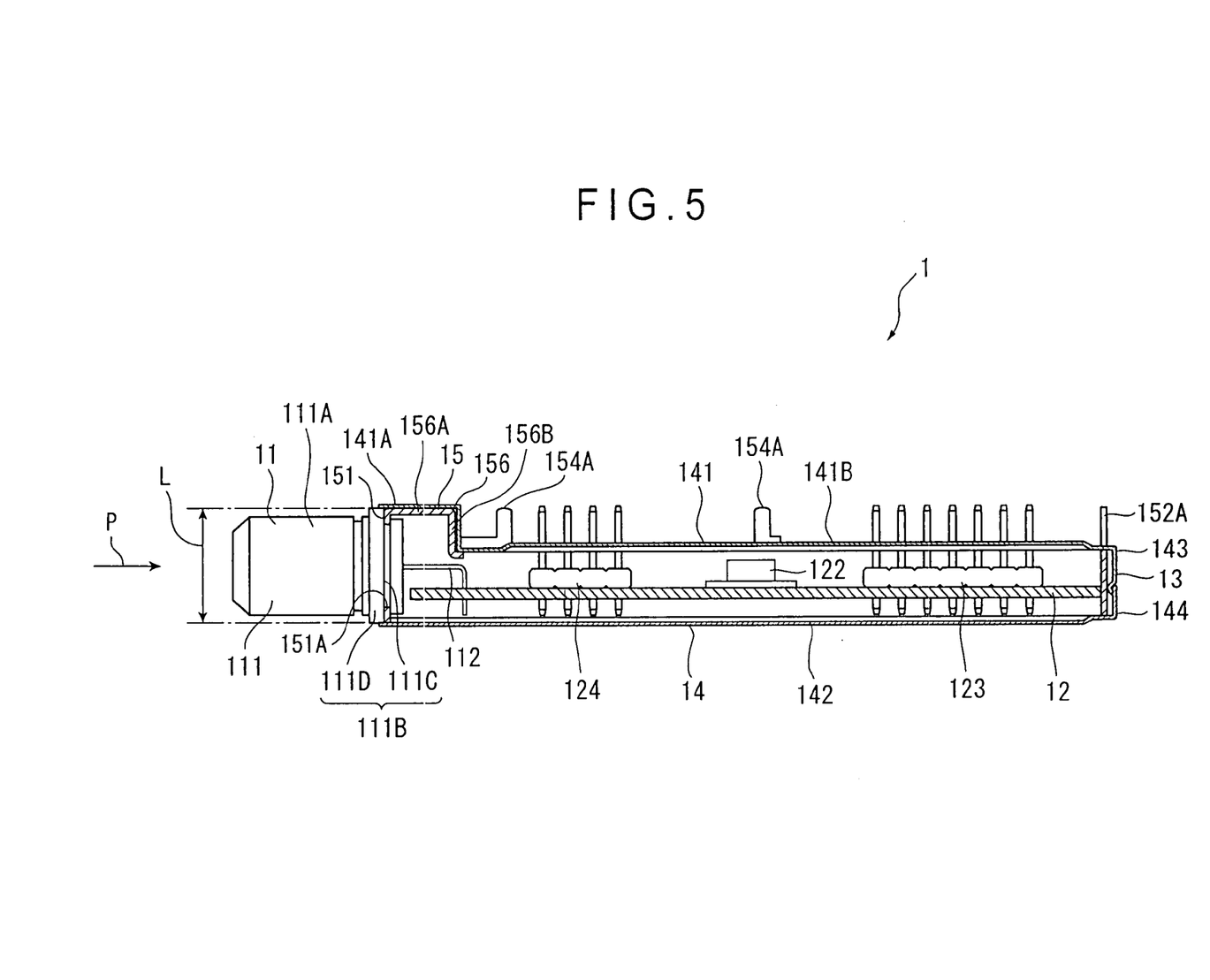
FIG. 5 is a cross sectional view of the tuner unit.

FIGS. 3 to 5 illustrate the tuner unit 1. The tuner unit 1 performs processes such as tuning so that a predetermined frequency signal is tuned from among signals including a plurality of different frequency signals having been input, amplification, frequency conversion for converting a signal into an intermediate frequency, and demodulation and outputs the processed signals to the circuit board 21 (shown in FIG. 2).

The tuner unit 1 includes two connectors 11 for inputting a plurality of different frequency signals, a tuner board 12 (shown in FIGS. 4 and 5), and a housing 13 (shown in FIGS. 4 and 5) for accommodating the tuner board 12.

As shown in FIG. 3, the connector 11, being an type F connector for receiving television wave, includes a connector body 111 (shown in FIGS. 2–5) to which a coaxial cable guiding the signals received by an antenna (not shown) is connected, and a center pin 112 (shown in FIGS. 4 and 5) which is generally L shaped and extending from the connector body 111.

The connector 11 is installed at one end of the tuner board 12 so that the direction of connection (depicted in FIG. 5 by an arrow P) with the coaxial cable or the like of the connector body 111 aligns with the surface of the tuner board 12.

The connector body 111 includes a cylindrical body 111A and a flat circular mounting element 111B installed at one end of the body 111A as depicted in FIGS. 4 and 5. The mounting element 111B includes a mounting element body 111C (shown in FIG. 5) to be clamped in a hole 151A (shown in FIGS. 4 and 5) of a first end face 151 (shown in FIG. 5) of a frame member 15 (shown in FIGS. 3–5) described below, and an abutting element 111D (shown in FIG. 5) having a larger diameter than the mounting element body 111C and abutting the first end face 151.

The center pin 112 is connected to the longitudinal end of the tuner board 12 in which inputting signals into the tuner board 12 is performed via the center pin 112.

Although the two connectors 11 are similar in size and shape, the nearer connector in FIG. 3 is referred to as a connector 11A, and the further connector is referred to as a connector 11B. Signals for digital satellite (BS) broadcasting are input from the connector 11A, while signals for digital terrestrial broadcasting are input from the connector 11B.

The tuner board 12 has a BS tuner 10 (see FIG. 6) installed thereon which performs tuning, frequency conversion, amplification and demodulation of signals fed from the connector 11A, together with a circuit element 122 (shown in FIG. 4 and 5) for performing these processes and a terminal 123 for outputting the processed signals to the circuit board 21. The direction of connection of the terminal 123 is chosen to be an out-of-plane direction of the tuner board 12 (a direction perpendicular to the tuner board 12).

Moreover, the tuner board 12 has a circuit and a terminal 124 installed thereon for outputting signals input from the connector 11B to the circuit board 21. The direction of connection of the terminal 124, being the same as with the terminal 123, is chosen to be an out-of-plane direction of the tuner board 12 (a direction perpendicular to the tuner board 12).

In addition, the terminals 123 and 124, and the circuit element 122 are installed on the same plane (surface) of the tuner board 12.

The tuner board 12 as stated above has a flat and generally rectangular shape, and has a notch cutting 121 (shown in FIG. 4) cut in a flat and rectangular shape at the end face of the side on which the connector 11 is to be installed.

The housing 13 (shown in FIG. 4) includes a cover member 14 having a first cover element 141 and a second cover element 142 covering the front and the back sides of the tuner board 12, and the frame member 15 disposed between the first cover element 141 and the second cover element 142 and surrounding the tuner board 12 for installing the connector 11 on the frame member 15.

The frame member 15 includes a first end face 151 (shown in FIGS. 2, 4, and 5) disposed along a short side on which the notch cutting 121 (shown in FIG. 4) of the tuner board 12 is formed, a second end face 152 (shown in FIG. 4) disposed along the other short side, a third end face 153 (shown in FIG. 4) and a fourth end face 154 (shown in FIG. 4) disposed along long sides of the tuner board 12.

The height dimension of the first end face 151 along a direction perpendicular to the tuner board 12 is longer than the height dimension of the second end face 152, and generally equal to the height dimension along a direction perpendicular to the direction of connection (depicted in FIG. 5 by an arrow P) of the abutting element 11D of the connector 11 (see FIG. 5). Generally circular holes 151A for installing the connectors 11A and 11B are formed on the first end face 151. By clamping mounting element bodies 111C of the mounting elements 111B of the connectors 11A and 11B to the holes 151A, the connectors 11A and 11B are secured to the first end face 151, with the bodies 111A of the connectors 11A and 11B exposed from the housing 13.

Here, the frame member 15 holds the tuner board 12, in which the tuner board 12 held by the frame member 15 is positioned within the limit of a height dimension L perpendicular to the direction of connection (depicted by an arrow P) of the connector 11 secured to the first end face 151 (see FIG. 5).

A projection 152A protruding toward an opposite direction against the tuner board 12 is formed on the second end face 152.

The edges of the first end face 151 side of the third end face 153 and the fourth end face 154 protrude toward an opposite direction against the tuner board 12, and the height dimension of the edge along a direction perpendicular to the tuner board 12 is generally equal to the height dimension of the first end face 151.

In addition, as with the second end face 152, projections 153A and 154A protruding toward an opposite direction against the tuner board 12 are formed on the third end face 153 and the fourth end face 154. Furthermore, the projections 153A and 154A, as well as the projection 152A of the second end face 152 are inserted into an insertion hole (not shown) formed on the circuit board 21 (shown in FIG. 2), whereby the tuner unit 1 is secured to the circuit board 21 (shown in FIG. 2).

In addition, among the edges along the direction of the short sides of the third end face 153 and the fourth end face 154, two joints 155 (shown in FIG. 4) are formed astride between those edges positioned on the circuit component installation side (surface) of the tuner board 12. An extension 156 (shown in FIG. 4) extends from the first end face 151 toward one of the two joints 155 on the side of the first end face 151.

The extension 156 has a first horizontal element 156A extending from an edge on the short side of the first end face 151 generally parallel to the tuner board 12, a vertical element 156B extending from the first horizontal element 156A toward the tuner board 12, and a second horizontal element 156C extending from the vertical element 156B generally parallel to the tuner board 12.

A circular hole 156D (shown in FIG. 4) is formed on the first horizontal element 156A. The diameter dimension of the hole 156D is made smaller than the diameter dimension of a boss 224 described below.

As shown in FIGS. 3–5, the cover member 14 includes the first cover element 141 covering the front side of the tuner board 12 (shown in FIGS. 4 and 5), and the second cover element 142 covering the back side of the tuner board 12 (shown in FIGS. 4 and 5).

The first cover element 141 abuts against the end edge of the front side of the tuner board 12 of the frame member 15, with the terminals 123 and 124 exposed. Formed on the first cover element 141 are a cover portion 141A disposed on the first horizontal element 156A of the extension 156, and a recess 141B denting toward the tuner board 12 (inward) relative to the cover portion 141A. On the cover portion 141A, a circular hole 141D is formed with a similar diameter dimension as the hole 156D of the first horizontal element 156A.

The recess 141B is a part corresponding to the exposed parts of the terminals 123 and 124, and a plurality of holes are formed on the recess 141B. In addition, engaging pieces 143 extending toward the tuner board 12 are formed on the cover portion 141A and the recess 141B, and the engaging piece engages with each of the end faces 151 to 154 of the frame member 15.

The second cover element 142 abuts against the end edge of the frame member 15 on the back side of the tuner board 12. Unlike the first cover element 141, the second cover element 142 is flat shaped, having no recess formed thereon. On the second cover element 142, a hole 142D is formed with a larger diameter than the hole 141D as well as a plurality of holes. Here, the size of the diameter of the hole 142D is sufficient for letting the boss 224 (shown in FIG. 2) described below pass through. In addition, as with the first cover element 141, engaging pieces 144 extending toward the tuner board 12 are formed, and the engaging piece 144 engages with each of the end faces 151 to 154 of the frame member 15.

The first cover element 141 and the second cover element 142 described above work as a shielding material, thereby preventing adverse effect due to electromagnetic wave or the like from outside, as well as preventing leakage of unwanted electromagnetic wave emitted from the tuner board 12 to outside.

In addition, the dimension between the cover portion 141A of the first cover element 141 of the cover member 14 and the second cover element 142, in other words, the maximum height dimension along the direction of connection of the connector 11 of the cover member 14 is generally equal to the height dimension along a direction perpendicular to the direction of connection (depicted in FIG. 5 by an arrow P) of the abutting element 111D of the mounting element 111B of the connector 11.

Now, the circuit board 21 and the external casing 22 will be described in further details referring to FIGS. 1, 2 and 6.

The circuit board 21, with a processing element 40 (shown in FIG. 6) such as an image processing circuit and an audio processing circuit installed thereon, has a function of generating video signals and audio signals from the signals processed by the tuner board 12. As shown in FIG. 2, the circuit board 21, being disposed generally parallel to the tuner board 12 of the tuner unit 1, is also disposed on the recess 141B of the first cover element 141. The circuit board 21 disposed on the recess 141B is positioned within the limit of the height dimension L (FIG. 5) perpendicular to the direction of connection (depicted by an arrow P) of the connector 11.

Here, the circuit board 21 and the tuner board 12 is connected by soldering the terminals 123 and 124 installed on the tuner board 12 to the circuit board 21.

Figure 6:
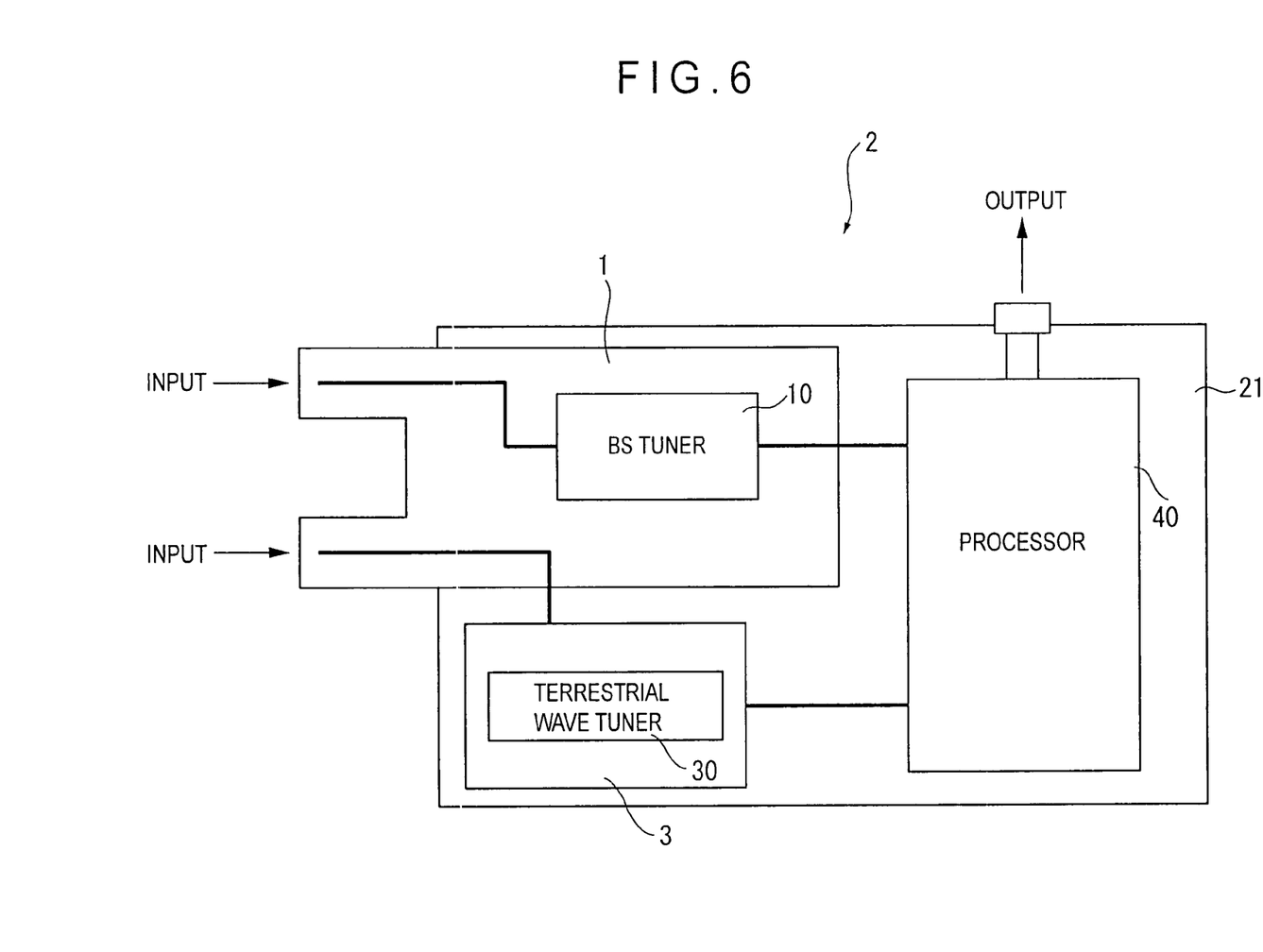
FIG. 6 is a schematic drawing illustrating the receiver.

In addition, as shown in the schematic drawings of FIGS. 1 and 6, the circuit board 21 has the other tuner unit 3 (FIG. 6) including a terrestrial tuner element 30 (FIG. 6) installed thereon for performing tuning, amplification, frequency conversion, demodulation or the like of ground wave signals, and a board (not shown) with a circuit performing these processes installed thereon. Because the tuner unit 3 does not have a connector to connect a coaxial cable, signals input to the connector 11B of the tuner unit 1 are fed to the tuner unit 3. In other words, signals input to the connector 11B of the tuner unit 1 are directly fed to the circuit board 21 via the circuit and the terminal 124 of the tuner board 12, resulting in an input from the circuit board 21 to the tuner unit 3. Then processes such as tuning are performed in the tuner unit 3, signals output from which are processed by the processing element 40 of the circuit board 21 and will be output as video signals and audio signals.

The external casing 22, including a box-like accommodating element 221, receives the tuner unit 1 and the circuit board 21, as shown in FIG. 2. The accommodating element 221 includes a flat and rectangular shaped bottom element 222 and a vertical element 223 rising at the peripheral edge of the bottom element 222, in which the surface opposing the bottom element 222 has an opening. A notch cutting 225 for exposing the connectors 11A and 11B is formed on a portion provided along the short side of the bottom element 222 of the vertical element 223.

Formed on the bottom element 222 is the boss 224 rising from the bottom element 222 in a similar manner as with the vertical element 223 and which is perpendicular to the tuner board 12 and the cover member 14. The boss 224 is hollow-cylindrical.

When installing the tuner unit 1 in the external casing 22, the boss 224 is faced upward, and the boss 224 is inserted into the hole 142D of the second cover element 142 of the cover member 14. The boss 224 then penetrates through the hole 142D of the second cover element 142 of the cover member 14 and the notch cutting 121 of the tuner board 12 and may subsequently be inserted into the tuner unit 1. A securing member, for example, a screw H is inserted into the boss 224 from the tip of the boss 224. The screw H penetrates through the hole 141D of the cover element 141, and the hole 156D of the extension 156 of the frame member 15, whereby the external casing 22 and the tuner unit 1 are secured.

According to the present embodiment, the following advantages can be obtained.

(1) Because the tuner board 12 is positioned within the limit of height dimension perpendicular to the direction of connection of the connector 11, the height dimension of tuner unit 1 can be fabricated lower than the related-art arrangement in which connectors are stacked on the tuner board whereby the tuner unit 1, the receiver 2 including the tuner unit 1, and the electronic device 5 incorporating the receiver 2 can be reduced in thickness.

(2) In addition, because the dimension between the cover portion 141A of the first cover element 141 of the housing 13 of the tuner unit 1 and the second cover element 142 is generally equal to the height dimension L along a direction perpendicular to the direction of connection (depicted by an arrow P) of the connector 11, the tuner unit 1 can be further reduced in thickness.

(3) In addition, the recess 141B is formed on the first cover element 141 of the cover member 14 of the housing 13 of the tuner unit 1, whereby the circuit board 21 is positioned within the limit of the height dimension L of the connector 11 when the circuit board 21 is disposed on the recess 141B. Because installation of the circuit board 21 does not exceed the height dimension L of the connector 11, the receiver 2 can be further reduced in thickness. The electronic device 5 including the receiver 2 thus reduced in thickness can be applied as portable products such as game devices.

(4) Furthermore, the tuner unit 1 includes the two connectors 11A and 11B, whereby signals input from the connector 11A are subsequently processed by the tuner board 12 in the tuner unit 1, and the signals input from the connector 11B are directly output to the circuit board 21. Therefore signals input from the connector 11B can be output to the other tuner unit 3 installed on the circuit board 21, whereby tuner units not having a connector, such as the tuner unit 3, can be employed.

In addition, because the connector 11B for outputting the input signals directly to circuit board 21 is pre-installed on the tuner unit 1, it is not necessary to newly install a connector for inputting signals when using the tuner unit 3 not having a connector, thereby saving the trouble of installation.

(5) In addition, because the receiver 2 includes the tuner unit 1 having the two connectors 11A and 11B, with signals input from the connector 11A being processed by the tuner board 12 in the tuner unit 1 and signals input from the connector 11B being output directly to the circuit board 21 for subsequent processing, signals from two different types of broadcasting, for example, digital satellite broadcasting and digital terrestrial broadcasting, can be processed in the single receiver 2.

(6) Furthermore, because the tuning circuit installed on the circuit board 21 of the receiver 2 is incorporated in the tuner unit 3 to be unitized, installation onto the circuit board 21 can be further facilitated.

(7) Moreover, in the present embodiment, when securing the tuner unit 1 to the external casing 22, the boss 224 of the external casing 22 is faced upward, the second cover element 142 of the cover member 14 is passed through the boss 224, and the screw H is inserted from the side of the first cover element 141 into the boss 224 for securing. Because of the arrangement in which the screw H is inserted from the side of (from above) the first cover element 141 into the boss 224, securing can be facilitated.

(8) In addition, because the boss 224 is passed through the second cover element 142 and inserted into the housing 13, the installation position of the tuner unit 1 on the external casing 22 can be easily determined.

Here, the present invention is not limited to the abovementioned embodiment, and any modifications, improvements or the like within a range which can accomplish the object of the present invention are included in the present invention.

For example, although the above embodiment describes an arrangement in which the tuner unit 1 includes the two connectors 11A and 11B and signals input from the connector 11B are output directly to the circuit board 21 via the tuner board 12, it should be noted that a branch circuit may be provided on the circuit board and signals processed by the circuit board may be output from the connector 11B via the tuner board 12. In this case, it is required that the tuner board 12 must have a path formed thereon including a circuit and a terminal for outputting signals fed from the circuit board directly to the connector 11B.

Therefore, it may not be necessary to newly install an output connector on the circuit board 21, because the connector 11B, which is one of the two connectors 11A and 11B installed on the tuner unit 1, can be employed as the connector for signal outputting. In this manner, the difficulties in manufacturing a receiver may be avoided.

Furthermore, although the tuner unit 3 for processing signals input from the connector 11B of the tuner unit 1 is installed on the circuit board 21 of the receiver 2 in the above embodiment, it need not be unitized. In other words, the tuning circuit for processing signals input from the connector 11B or the like may be directly installed on the circuit board 21.

In addition, although it is assumed in the above embodiment that the receiver 2 receives two types of broadcasting, i.e., digital satellite broadcasting and digital terrestrial broadcasting, an arrangement may be provided so that three or more types of broadcasting of equal may be received. For example, an arrangement may be conceivable in which digital cable broadcasting may be received in addition to digital satellite broadcasting and digital terrestrial broadcasting. In this case, an arrangement may be provided in which a third connector is installed on the tuner unit, and signals input from the third connector are processed by a new tuner unit installed on the circuit board. In addition, an arrangement may be provided in which a new tuner unit having a third connector thereon is installed on the circuit board.

In addition, an arrangement may be possible in which the receiver receives one type of broadcasting only. In this case, a single connector on the tuner unit may be sufficient.

Furthermore, although the receiver 2 receives both video signals and audio signals in the arrangement of the above embodiment, an arrangement may be possible in which only one of the signals is received. For example, it may be assumed that only audio signals (signals such as AM broadcasting or FM broadcasting) are received.

In addition, although it is assumed in the above embodiment that digital terrestrial signals received by an antenna are input to the other connector 11B of the receiver 2, it is not limited to such an arrangement. For example, another connector may be used for connecting to a telephone network or the like.

Furthermore, although the boss 224 is provided on the external casing 22 of the receiver 2 in the above embodiment, the boss 224 need not be formed. In this case, it is sufficient to secure the first end face 151 of the frame member 15 of the tuner unit 1 to the vertical element of the external casing by a securing member such as a screw.

In addition, an arrangement is proposed in the above embodiment, in which the recess 141B is formed on the first cover element 141 of the housing 13 of the tuner unit 1 and the circuit board 21 disposed on the recess 141B is positioned within the limit of the height dimension L of the connector 11, an arrangement may be provided in which the circuit board 21 disposed on the recess may stick out from the height dimension of the connector 11. Also in this case, owing to the recess formed in cover element 141, the thickness can be further reduced than the case in which a recess is not formed.

Furthermore, the recess 141B need not to be formed on the cover element 141. Also in this case, the receiver can be reduced in thickness because the tuner unit 1 is reduced in thickness compared with related-art. In addition, manufacturing of the receiver 2 as well as the tuner unit 1 can be facilitated because the process of forming the recess 141B on the cover element 141 can be omitted.

INDUSTRIAL APPLICABILITY

As stated above, a tuner unit of the present invention, and a receiver or an electronic device including the tuner unit are useful for receiving broadcasting such as digital satellite broadcasting, digital terrestrial broadcasting, and can be applied to portable products or the like because they can be reduced in thickness.

The invention claimed is:

1. An electronic device comprising a receiver for tuning to a predetermined frequency signal from among signals including a plurality of different frequency signals, processing the predetermined frequency signal and outputting the predetermined frequency signal outward, the receiver comprising:

a tuner unit for tuning; and a circuit board having the tuner unit mounted thereon and having a circuit element installed thereon for receiving the predetermined frequency signal fed from the tuner unit, the tuner unit comprising:

a connector for inputting the plurality of different frequency signals;

a tuner board having a further circuit element installed thereon for tuning to signals input to the connector and having a terminal installed thereon for outputting the predetermined frequency signal to the circuit board; and a housing for accommodating the tuner board with the connector and the terminal exposed, wherein the connector is installed on an edge of the tuner board so that a direction along the surface of the tuner board is chosen to be the direction of connection, wherein the tuner board is positioned within the limit of a height dimension perpendicular to the direction of connection of the connector, wherein the direction of connection of the terminal is chosen to be an out-of-plane direction of the tuner board, wherein a recess protruding inward for disposing the circuit board is provided on a portion of the housing where the terminal is exposed, and wherein the circuit board disposed on the recess is positioned within the limit of the height dimension of the connector.

2. A tuner unit installed on a circuit board for tuning to a predetermined frequency signal from among signals including a plurality of different frequency signals and for outputting the predetermined frequency signal to the circuit board, the tuner unit comprising:

a connector for inputting the plurality of different frequency signals; and a tuner board having a circuit element installed thereon for tuning the plurality of different frequency signals input to the connector and having a terminal installed thereon for outputting the predetermined frequency signal to the circuit board, wherein the connector is installed on an edge of the tuner board so that a direction along a surface of the tuner board is chosen to be the direction of connection, wherein the tuner board is positioned within the limit of a height dimension perpendicular to the direction of connection of the connector, wherein the direction of connection of the terminal is chosen to be an out-of-plane direction of the tuner board, wherein the tuner unit includes a housing for accommodating the tuner board with the connector and the terminal exposed, and wherein the housing has a recess provided thereon, the recess protruding inward at a portion of the housing where the terminal is exposed, and when the circuit board is disposed on the recess, the circuit board is positioned within the limit of the height dimension of the connector.

3. A tuner unit installed on a circuit board for tuning to a predetermined frequency signal from among signals including a plurality of different frequency signals and for outputting the predetermined frequency signal to the circuit board, the tuner unit comprising:

a connector for inputting the plurality of different frequency signals; and a tuner board having a circuit element installed thereon for tuning the plurality of different frequency signals input to the connector and having a terminal installed thereon for outputting the predetermined frequency signal to the circuit board, wherein the connector is installed on an edge of the tuner board so that a direction along a surface of the tuner board is chosen to be a direction of connection, wherein the tuner board is positioned within the limit of a height dimension perpendicular to the direction of connection of the connector, and wherein the tuner unit includes another connector different from the connector, and wherein the tuner board has a path including a circuit and a terminal for outputting signals fed to the other connector directly to the circuit board, or a path including a circuit and a terminal for outputting signals fed from the circuit board to the other connector.

4. A receiver for tuning to a predetermined frequency signal from among signals including a plurality of different frequency signals, processing the predetermined frequency signal and outputting the predetermined frequency signal outward, the receiver comprising:

a tuner unit for performing tuning; and a circuit board having the timer unit mounted thereon and having a circuit element installed for receiving the predetermined frequency signal fed from the tuner unit, the tuner unit comprising:

a connector for inputting the plurality of different frequency signals;

a tuner board having a further circuit element installed thereon for tuning said plurality of different frequency signals input to the connector and having a terminal installed thereon for outputting the predetermined frequency signal to the circuit board; and a housing for accommodating the tuner board with the connector and the terminal exposed, wherein the connector is installed on an edge of the tuner board so that a direction along a surface of the tuner board is chosen to be a direction of the connector, wherein a direction of connection of the terminal is chosen to be an out-of-plane direction of the tuner board, wherein a recess protruding inward for disposing the circuit board is provided on a portion of the housing where the terminal is exposed, and wherein the circuit board disposed on the recess is positioned within the limit of the height dimension of the connector.

5. The receiver according to claim 4, further comprising: an external casing for accommodating the tuner unit and the circuit board, wherein the housing includes a cover member having a pair of cover elements covering front and back sides of the tuner board, and a frame member disposed between the pair of cover elements and surrounding the tuner board for installing the connector on the frame member, wherein the frame member includes an extension along the tuner board, wherein the external casing has a boss provided thereon extending in a direction perpendicular to the tuner board and penetrating through at least one of the cover elements and subsequently being inserted into the housing, and wherein the extension of the frame member and the cover member are secured to the boss.

6. The receiver according to claim 4, wherein the tuner unit includes another connector for inputting signals different from those fed via the connector, wherein the tuner board has a path provided thereon including a circuit and a further terminal for outputting signals fed to the other connector directly to the circuit board, and wherein the circuit board has a tuning circuit installed thereon for tuning to signals input via the path.

7. The receiver according to claim 6, wherein the tuner unit and the tuning circuit perform tuning of signals based on mutually different broadcasting types.

* * * * *